(12) United States Patent
Pizzato

(10) Patent No.: US 12,287,626 B2
(45) Date of Patent: Apr. 29, 2025

(54) DEVICE AND METHOD FOR THE CONTROL OF SAFETY APPARATUSES

(71) Applicant: PIZZATO ELETTRICA S.R.L., Marostica (IT)

(72) Inventor: Giuseppe Pizzato, Marostica (IT)

(73) Assignee: PIZZATO ELETTRICA S.R.L., Marostica (IT)

( * ) Notice: Subject to any disclaimer, the term of this patent is extended or adjusted under 35 U.S.C. 154(b) by 0 days.

(21) Appl. No.: 18/010,508

(22) PCT Filed: May 31, 2021

(86) PCT No.: PCT/IB2021/054768
§ 371 (c)(1),
(2) Date: Dec. 15, 2022

(87) PCT Pub. No.: WO2021/255561
PCT Pub. Date: Dec. 23, 2021

(65) Prior Publication Data
US 2023/0229118 A1    Jul. 20, 2023

(30) Foreign Application Priority Data
Jun. 16, 2020   (IT) ........................ 102020000014413

(51) Int. Cl.
| G05B 9/02 | (2006.01) |
| G01R 31/327 | (2006.01) |
| G05B 9/03 | (2006.01) |
| G05B 19/048 | (2006.01) |
| H01H 3/02 | (2006.01) |
| H01H 9/20 | (2006.01) |
| H01H 47/00 | (2006.01) |

(52) U.S. Cl.
CPC ............ *G05B 9/03* (2013.01); *G01R 31/3275* (2013.01); *G05B 19/048* (2013.01); *H01H 3/022* (2013.01); *H01H 9/20* (2013.01); *H01H 47/002* (2013.01)

(58) Field of Classification Search
CPC .. G01R 31/2829; G01R 31/3275; G05B 9/00; G05B 9/02; G05B 9/03; G05B 19/0428; G05B 19/048; G05B 19/406; H01H 3/022; H01H 47/00; H01H 47/002; H01H 47/004; H01H 47/005; H01H 71/04
See application file for complete search history.

(56) References Cited

U.S. PATENT DOCUMENTS

| 2011/0204729 | A1* | 8/2011 | Lorenz | ................. | H01H 47/004 |
| | | | | | 307/326 |
| 2014/0319928 | A1* | 10/2014 | Papenbreer | ............ | H01H 69/01 |
| | | | | | 307/113 |
| 2016/0252891 | A1* | 9/2016 | Hutt | ................... | G05B 19/0423 |
| | | | | | 700/83 |

\* cited by examiner

*Primary Examiner* — Levi Gannon
(74) *Attorney, Agent, or Firm* — Rivka Friedman

(57) ABSTRACT

A device for controlling a safety apparatus comprises at least one OSSD-type output having an output terminal to be connected to a corresponding input of the safety apparatus, said OSSD output being powerable to a maximum threshold value and to a minimum threshold value of the supply voltage suitable for determining respectively the ON and OFF conditions of said at least one output, a control circuit suitable for carrying out a test of the operation of said at least one OSSD output by sending test micropulses for switching said output terminal to said minimum threshold value to send an error signal to the safety in case of detection of a value different from said minimum threshold value, said control circuit being adapted to generate test micropulses having variable or adjustable duration.

14 Claims, 3 Drawing Sheets

DEVICE AND METHOD FOR THE CONTROL OF SAFETY APPARATUSES

TECHNICAL FIELD

The present invention finds application in the field of electrical devices for industrial use and has particularly as its object a device and a method for the control of safety apparatuses used for the control of industrial machines or plants, such as safety sensors, safety switches or, again, security modules.

STATE OF THE ART

As known, the acronym OSSD (Output Signal Switching Device) indicates the safe switching outputs of safety devices whose purpose is to safely signal an event related to safe conditions in the operation of a machine or system.

Generally, safety devices with OSSD outputs, such as safety sensors, safety switches and safety modules, have two OSSD outputs which must be analyzed separately from each other.

Therefore, these devices are used in safety applications, such as monitoring operations of accesses to potentially dangerous areas of a machine or plant, or of moving parts of a machine or plant.

For example, in the case of a safety device with OSSD outputs used to control an access, this device can be placed at the access so that, in the event of the detection of an open access, the OSSD can signal the event, through the output terminals, to the safety control circuit of the system, which can thus stop the machine or plant and avoid potential risks for persons present in the vicinity or within the safety perimeter. To meet high safety levels, OSSDs usually include at least one pair of redundant electrical output terminals.

In the event that there are no events relevant to safety (for example in the case of closed access), both the first output terminal and the second output terminal are powered with the highest voltage level, for example 24 V.

If it is necessary to report events relevant to security to the safety control system (for example, the opening of access), the OSSD switches the first and second output terminals to a low level, for example 0 V.

This voltage variation is detected by the safety control system which can intervene to stop the plant or the controlled machine.

The use of two redundant output terminals allows a safe transmission of information from the OSSD to the safety control system, even in the event of errors on one of the output terminals, as the switching to low level can be transmitted to the control system via the undamaged output terminal.

Generally, to detect such faults on the safe outputs, i.e. on the two output terminals, so-called test pulses are used, i.e. tests carried out by generating test pulses applied to the output terminals.

By means of these test pulses, each output terminal is switched to a low voltage level for a very limited period, of the order of hundreds of microseconds, so as to verify, by monitoring the test pulses, the presence of any unwanted connections, such as short circuits or electrical cross connections between the first and second output terminals. EP3358592 discloses a device with OSSD outputs which comprises a first output terminal and a second output terminal and voltage reduction means providing a first voltage of a smaller magnitude than a supply voltage, second voltage reduction means providing a second voltage of smaller magnitude than the first voltage, wherein the second voltage is applied to the first terminal output and the first voltage is applied to the second output terminal, and wherein switching means are provided which are adapted to separate the second voltage from the first output terminal and/or the first voltage from the second output terminal, if the magnitude of the voltage at the second output terminal is equal to or greater than the amplitude of the supply voltage and/or if the magnitude of the voltage at the first terminal output is equal to or greater than the amplitude of the first voltage.

WO2004059677 discloses a safety control device which comprises two controllable switching circuits whose output terminals are interconnected to form the output of the safety switching device; a first test switching pulse can be sent cyclically to the first switching circuit and a second test switching pulse, offset from the first, can be fed cyclically to the other switching circuit; the switching circuits are designed in such a way that the output voltage of the safety switching device fluctuates upon receipt of the test pulses staggered by an amplitude which deviates from the amplitude of the output voltage upon receipt of simultaneous test pulses, triggering the intervention of the safety system in the case of receiving simultaneous test pulses.

The limit of the known solutions consists of the need to adapt the length of the micropulses on the OSSD outputs according to the load of the device adapted to detect OSSD signals, which may also vary according to the technical specifications adopted by the specific manufacturer.

Consequently, there is a risk that the safety device associated with a control device risks going into error if the load is different from that which the OSSD outputs are calibrated for.

SCOPE OF THE INVENTION

The object of the present invention is to overcome the aforementioned drawbacks, by providing a device and a method for controlling safety apparatuses, in particular provided with OSSD outputs, which have features of high efficiency and relative cost effectiveness.

A particular object is to provide a device and a method for controlling safety apparatuses, in particular provided with OSSD outputs, which can automatically adapt to the type of load constituted by the device which detects the OSSD signals.

Still another particular object is to provide a device and a method for controlling safety apparatuses, in particular provided with OSSD outputs, wherein the safety apparatus does not go into error due to different loads due to the different possible devices on the market.

Still another particular object is to provide a device and a method for controlling safety apparatuses, in particular provided with OSSD outputs, which allows to set the duration of the micropulsation in a personalized way for the user without making any hardware variations.

These objects, as well as others that will become more apparent hereinafter, are achieved by a control device for safety apparatuses which, according to claim 1, comprises at least one output of the OSSD type, preferably a pair of outputs, having an output terminal adapted to be connected to a corresponding input of the safety apparatus adapted to detect the signals coming from said at least one OSSD output, said at least one OSSD output being powered at a maximum threshold value and a minimum threshold value of the supply voltage to determine respectively the on and off conditions of said at least one output, a control circuit adapted to carry out a test of the operation of said at least one OSSD output by sending test micropulses for switching said output terminal to said minimum threshold value to send an error signal to the safety apparatus in case of detection of a value different from said minimum threshold value, said control circuit being adapted to generate test micropulsations having variable or modifiable duration according to the defined load of the circuit located downstream of said at least one OSSD output.

Thanks to this feature, the device will automatically adapt to the type of load constituted by the device that detects the OSSD signals, preventing the safety device from failing due to different loads due to the different possible devices on the market.

According to a further aspect of the invention, a safety apparatus is provided with the control device in accordance with claim 7.

According to a further aspect of the invention, a safety apparatus control method is provided in accordance with claim 9.

Advantageous embodiments of the invention are obtained in accordance with the dependent claims.

BRIEF DISCLOSURE OF THE DRAWINGS

Further features and advantages of the invention will become more apparent in the light of the detailed description of some preferred but not exclusive embodiments of the device, illustrated by way of non-limiting example with the aid of the accompanying drawing table wherein.

BEST MODES OF CARRYING OUT THE INVENTION

A control device according to the invention will be designed to be associated in particular with a safety apparatus used to control industrial machines or plants, or parts thereof.

In particular, the control device may be applied to safety sensors or safety switches designed to be applied at the access doors of perimeters or safety barriers of machines or industrial plants or other systems used to control the safety perimeter in order to always allow safe access inside the perimeter or in correspondence with movable parts of a machine or plant, to signal potentially dangerous conditions, such as the condition of an open access door or an unauthorized position of a movable part of the machine or plant.

The control device will also be applicable to safety modules that can be inserted into safety circuits for the control of machines or industrial plants.

The configuration of these safety apparatuses is not limiting to the present invention and therefore they will not be described in more detail below.

Figure 1:
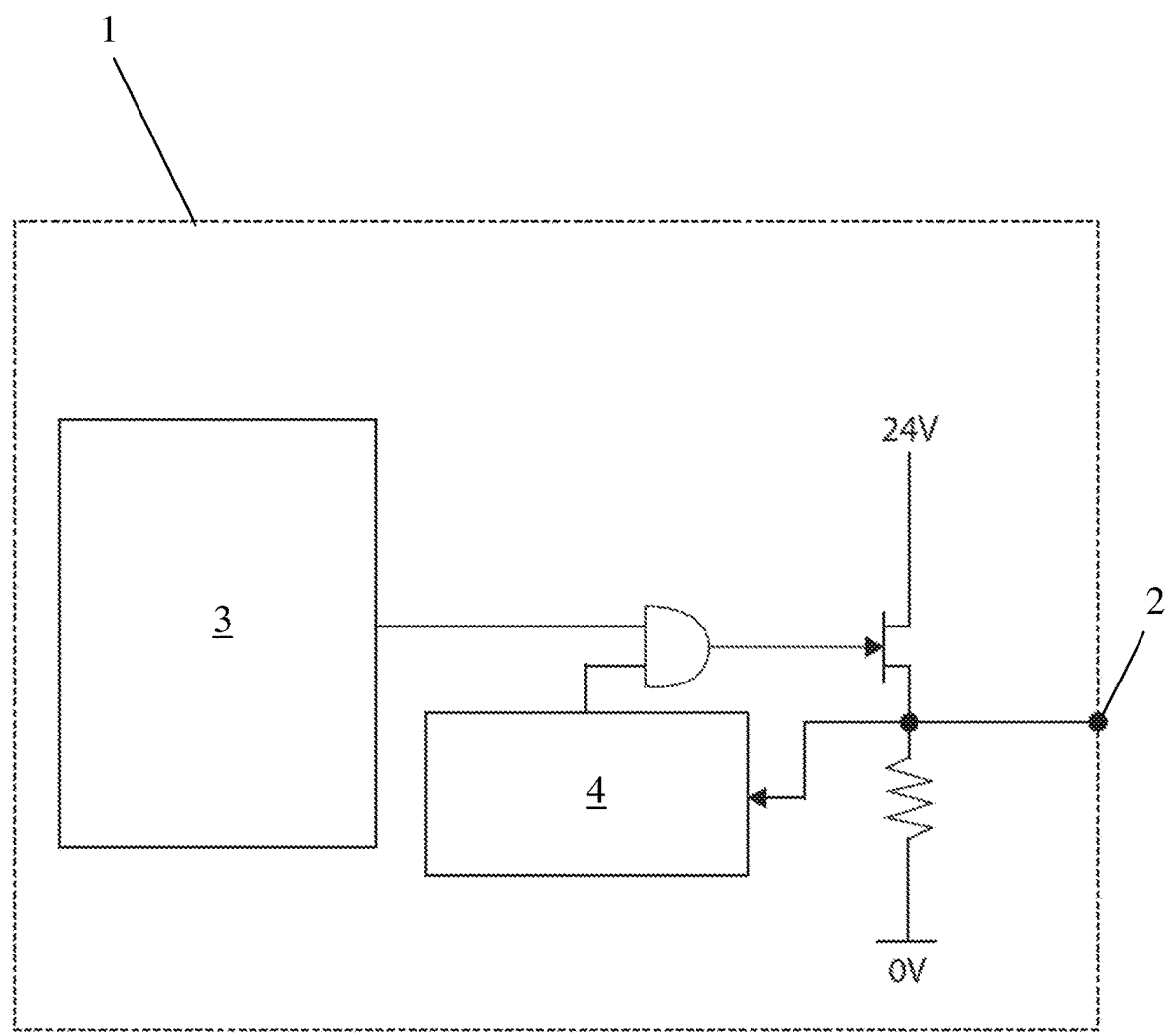
FIG. 1 is a schematic illustration of the device according to the invention.

FIG. 1 schematically illustrates the logic structure of the control device, generally indicated with 1, which essentially comprises at least one output 2 of the OSSD type, preferably a pair of outputs.

In a known manner, each OSSD output 2 has an output terminal adapted to be connected to a corresponding input of the safety apparatus adapted to detect the signals coming from the OSSD outputs 2.

Typically for this kind of device, the OSSD outputs 2 may be powered by two different voltage levels, i.e. at a maximum threshold value, generally 24V, and at a minimum threshold value, generally 0V, of the supply voltage.

In correspondence with these maximum and minimum threshold values, the on and off switching conditions of the OSSD outputs 2 will be respectively determined, to which an unsafe condition and a safe condition of the machine or plant, or related part, controlled by the safety apparatus correspond.

The device 1 also comprises a control circuit 3 for the voltage supply of the OSSD outputs 2 and a control circuit 4 suitable for carrying out a test of the operation of the OSSD outputs 2 by sending test micropulses for switching the output terminals at the minimum threshold value.

The purpose of the test is to verify that in the safety condition, the OSSD outputs 2 actually pulse at the minimum voltage state and that there are no conditions correlated to dangerous situations, i.e. values higher than the minimum threshold value, in which case an error signal would be sent to the safety apparatus to allow the machine or system or the relative controlled movable part to stop.

According to a peculiar feature of the invention, the control circuit 4 is adapted to generate test micropulsations having a variable or modifiable duration according to the defined load of the circuit located downstream of the OSSD outputs 2.

In particular, according to a first operating mode, the control circuit 4 may vary the duration of the test micropulsations in a dynamic manner, adapting it to the specific load.

The load can be capacitive, inductive, resistive or similar.

More precisely, the duration of the micropulsation will not be predetermined but can be extended starting from a minimum duration value up to a predetermined maximum value of a specific suitably programmed interval.

Figure 2:
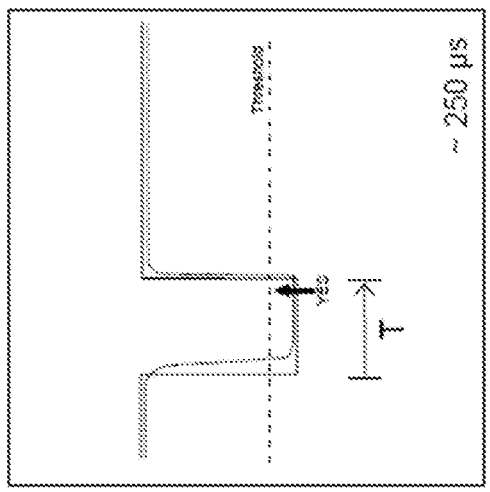
FIG. 2 shows a pulse diagram relating to three different operating modes of the device associated with three different loads.
Figure 2:
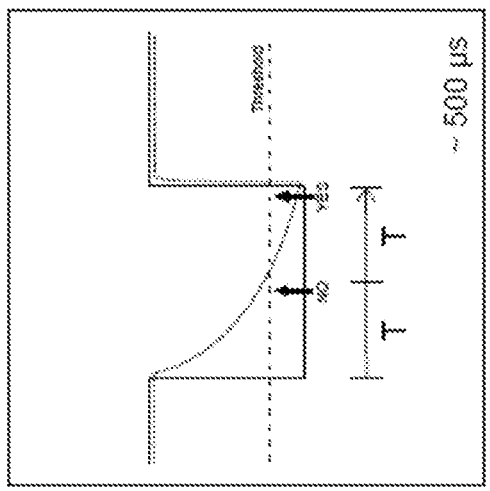
Figure 2:
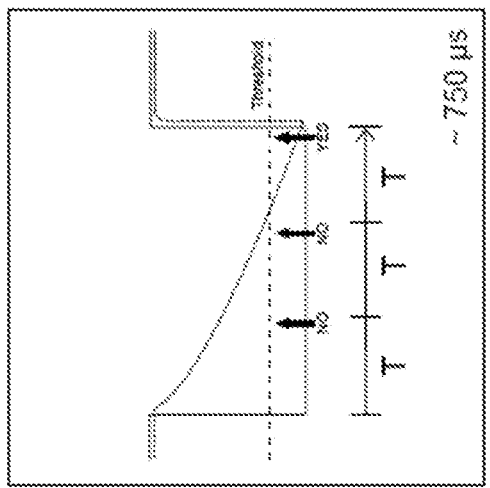

This operating mode will allow to detect a low load by means of a micropulsation of minimum duration, as in the case of the first image from the left of FIG. 2.

In the case of a higher load, the duration of the micropulsation will extend up to the maximum value of the interval, as in the image on the right of the same FIG. 2.

If, after a micropulsation of maximum duration, the control circuit does not find the minimum threshold value, i.e. a value lower than the minimum threshold value, the error signal will be generated.

In practice, after the line has been switched off, its periodic sampling is carried out to check whether it has actually switched off, by sending a micropulsation of minimum duration; if after this minimum period the test should fail, the micropulsation would be prolonged up to the maximum value, only after which, in the absence of detection, the error signal would be generated.

The dynamic modulation of the amplitude of the micropulsation allows to eliminate possible reports of false errors that could be related to the use of too short micropulsations in combination with pulsations of the OSSD outputs 2 having a less steep descent curve and which could lead to believe that the OSSD output 2 is not switched to the minimum value, as the micropulsation could intercept the signal at the descent curve.

It follows that the device 1 thus programmed may be adapted to any type of safety apparatus, which can be advantageously classified according to several categories in accordance with the various standards or technical specifications used in the sector.

For example, the same safety equipment may be classified as class A, B or C according to the specifications of the ZVEI (German Association of Electrical and Electronic Manufacturers) defined in the Position Paper CB24I "Classification of Binary 24 V Interfaces—Functional Safety aspects covered by dynamic testing"; Edition 2.0.1.

From a theoretical point of view, there are no maximum or minimum limits for the extremes of the time interval.

For example, if you want to fall within the aforementioned ZVEI specifications, the minimum value of the interval may be 250 µs while the maximum value may be 1000 µs.

According to a further operating mode, the control circuit 4 may be programmed to set a fixed duration of the test micropulsations, but always in a programmable manner by the user or directly by the manufacturer.

Similarly, the minimum threshold value of the power supply voltage may also be programmable by the user and/or by the manufacturer.

The control circuit 4 will also be programmed to carry out one or more samplings of the instantaneous voltage value within the duration interval of the micropulsations to check if the instantaneous value is lower or higher than the set threshold value.

In general, it may be sufficient to perform a single sampling near the end of the micropulsation interval.

Figure 3:
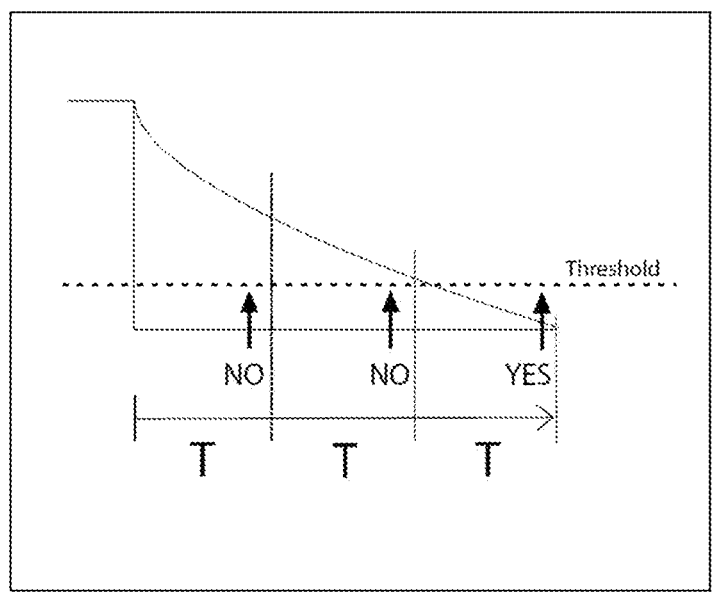
FIG. 3 illustrates a first sampling operating mode of the control circuit.

According to a further operative modality, schematized in FIG. 3, the samplings can be carried out at regular time intervals T, with a constant value period.

According to yet another variant, not illustrated, multiple samplings can be performed for each of the periods T into which the duration interval of the micropulsation is divided.

Figure 4:
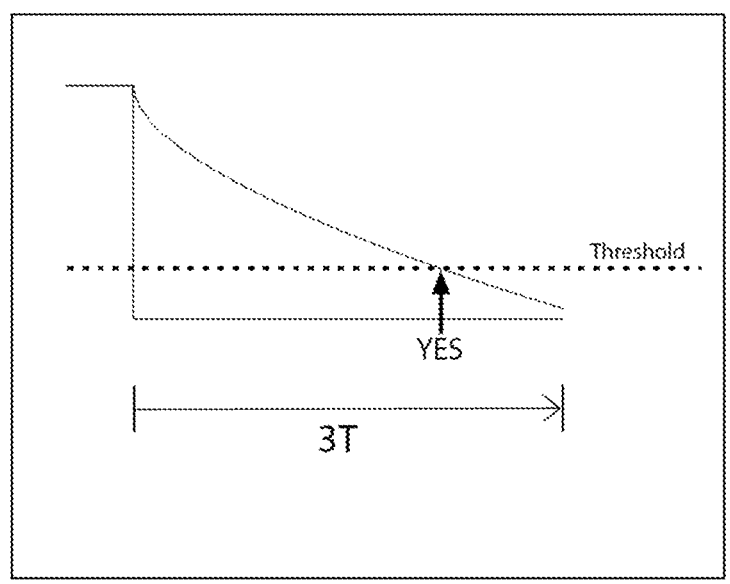
FIG. 4 illustrates a second operating mode for sampling the control circuit.

On the other hand, FIG. 4 illustrates a further operating mode in which the control circuit 4 is adapted to perform a substantially continuous sampling, i.e. at extremely small intervals between one sampling and the next such as not to allow a solution of continuity between subsequent samplings to be appreciated.

In this case, however, it will be appropriate for the control circuit 4 to have an analog type input for reading the voltage value, as opposed to the previous configuration in which the input would be digital.

Advantageously, all the modifications made to the control circuit 4 may be carried out via firmware, without making any hardware modifications.

From above it is apparent that the device according to the invention achieves the indicated objects.

However, it is understood that the device, the apparatus and the method according to the invention are susceptible to numerous modifications and variations, all falling within the inventive concept expressed in the attached claims.

The invention claimed is:

1. A device for controlling a safety apparatus, comprising:
at least one Output Signal Switching Device (OSSD) output having an output terminal adapted to be connected to a corresponding input of the safety apparatus adapted to detect the signals coming from said at least one OSSD output, said at least one OSSD output being powerable to a maximum threshold value and to a minimum threshold value of a supply voltage suitable for determining respectively ON and OFF conditions of said at least one output; and
a control circuit suitable for carrying out a test of the operation of said at least one OSSD output by sending test micropulses for switching said output terminal to said minimum threshold value to send an error signal to the safety apparatus in case of detection of a value different from said minimum threshold value;
wherein said control circuit is adapted to generate test micropulses having variable or adjustable duration interval according to the defined load of the circuit located downstream of said at least one OSSD output,
wherein said control circuit is also adapted to carry out one or more samplings of an instantaneous voltage value within said duration interval of said micropulses to check when said instantaneous voltage value is lower than a threshold value, and wherein an error signal is generated if, after a micropulsation of maximum duration, said control circuit does not find said minimum threshold value of the supply voltage or a value of the supply voltage lower than said minimum threshold value.

2. The device as claimed in claim 1, wherein said control circuit is adapted to adjust the duration of said test micropulses dynamically within a range of values having a predetermined minimum and maximum.

3. The device as claimed in claim 1, wherein said control circuit is adapted to carry out one or more samplings of the instantaneous voltage value within said duration interval of said micropulses to check when said instantaneous value is higher than said maximum threshold value.

4. The device as claimed in claim 3, wherein said samplings are performed at regular time intervals with a period of constant value.

5. The device as claimed in claim 3, wherein said control circuit comprises an analog type input for performing a substantially continuous sampling within said duration interval of said micropulses.

6. The device as claimed in claim 1, wherein said control circuit is adapted to set a fixed duration for said test micropulses in a programmable manner by the user or the manufacturer.

7. The device as claimed in claim 1, wherein said minimum threshold value of the supply voltage is programmable by the user and/or by the manufacturer.

8. The device as claimed in claim 7, wherein said load is of the inductive, or resistive type.

9. The device as claimed in claim 1, wherein said load is of the capacitive type.

10. A safety apparatus having input terminals connected to OSSD type output terminals associated with a control device according to claim 1.

11. The safety apparatus as claimed in claim 10, wherein said apparatus is selected from the group comprising safety sensors, safety switches, multifunction safety modules.

12. The device as claimed in claim 1, wherein said at least one OSSD output is a pair of OSSD outputs.

13. A method for controlling a safety apparatus provided with one or more OSSD outputs each having an output terminal adapted to be connected to a corresponding input terminal of a safety device adapted to detect the signals coming from said OSSD outputs, said OSSD outputs being fed to respective maximum and minimum threshold values of a supply voltage suitable for determining respectively ON and OFF conditions of said outputs, the method comprising:
sending, during a test phase of said OSSD outputs, test micropulses to said output terminals adapted to switch said output terminals to the respective minimum threshold value to send an error signal to the safety apparatus in case of detection of a value different from said minimum threshold value; wherein said test micropulses have variable or modifiable duration interval according to the defined load of the circuit located downstream of said at least one OSSD output;

carrying out one or more samplings of an instantaneous voltage value within said duration interval of said test micropulses to check when said instantaneous voltage value is lower than a threshold value; and generating an error signal if, after a micropulsation of maximum duration, said minimum threshold value of the supply voltage or a value of the supply voltage lower than said minimum threshold value is not detected.

14. The method as claimed in claim 13, wherein the duration of said test micro-pulsations are dynamically variable within a range having predetermined minimum and maximum values.

* * * * *